United States Patent [19]

Goble

[11] 3,982,142

[45] Sept. 21, 1976

[54] PIEZOELECTRIC TRANSDUCER ASSEMBLY AND METHOD FOR GENERATING A CONE SHAPED RADIATION PATTERN

[75] Inventor: Ralph W. Goble, Eldora, Colo.

[73] Assignee: Sontrix, Inc., Boulder, Colo.

[22] Filed: May 20, 1974

[21] Appl. No.: 471,280

Related U.S. Application Data

[63] Continuation-in-part of Ser. No. 412,884, Nov. 5, 1973.

[52] U.S. Cl. .................... 310/8.2; 310/9.1; 340/8 FT; 179/110 A

[51] Int. Cl.² .................... H01L 41/04

[58] Field of Search .................... 310/8.2, 9.1, 9.4; 181/142, 153, 160, 33 C, 33 E; 179/110 A; 340/8 FT

[56] References Cited

UNITED STATES PATENTS

| | | | |
|---|---|---|---|
| 1,985,251 | 12/1934 | Hayes | 340/8 FT |
| 2,005,741 | 6/1935 | Hayes | 340/8 FT |
| 3,243,768 | 3/1966 | Roshon, Jr. et al. | 340/8 FT |
| 3,325,779 | 6/1967 | Supernaw et al. | 310/8.5 UX |
| 3,703,652 | 11/1972 | Noda | 310/8.3 |
| 3,742,442 | 6/1973 | Leyde et al. | 310/9.1 X |
| 3,748,637 | 7/1973 | Larson et al. | 310/9.1 X |

*Primary Examiner*—Mark O. Budd
*Attorney, Agent, or Firm*—Max L. Wymore

[57] ABSTRACT

A transducer assembly which generates a cone shaped radiation pattern concentric with a selected axis is formed by a piezoelectric element mounted in a cylindrical resonant cavity defined by a Helmholtz chamber. Circumferentially spaced apart and radially aligned circular apertures are formed in the chamber's cylindrical side wall and an inclined reflecting plate is spaced apart from the apertures a selected distance. The plate extends outwardly from the chamber at an angle of less than 90° to the chamber axis. The cone shaped radiation pattern is produced by generating a plurality of discrete spherical radiation patterns, combining these patterns to form an annular radiation pattern and partially reflecting the annular radiation pattern from an inclined reflection plate extending at an angle to the chamber axis of less than 90° to produce a cone shaped radiation pattern.

23 Claims, 11 Drawing Figures

PIEZOELECTRIC TRANSDUCER ASSEMBLY AND METHOD FOR GENERATING A CONE SHAPED RADIATION PATTERN

This application is a continuation-in-part of U.S. application Ser. No. 412,884, filed Nov. 5, 1973, entitled "PIEZOELECTRIC TRANSDUCER ASSEMBLY AND METHOD FOR GENERATING AN UMBRELLA SHAPED RADIATION PATTERN."

BACKGROUND OF THE INVENTION

The present invention relates to piezoelectric transducer assemblies and methods for generating radiation patterns.

Piezoelectricity is pressure electricity and piezoelectric behavior is the characteristic of materials to deform upon the application of electrical signals or conversely to develop electricity whenever deformed by the application of pressure. Materials exhibiting piezoelectric behavior are naturally occurring or may be man made.

Heretofore, planar piezoelectric elements which vibrate at a natural resonant frequency have been employed in transducer assemblies, particularly ultrasonic transducer assemblies. When vibrating at their natural resonant frequency, such planar piezoelectric elements flex about a node defined thereon; the portion of the element on one side of the node always vibrating in a direction opposite to the direction of vibration of the portion of the element on the other side of the node. A planar piezoelectric element having this type of vibration generates or senses compression and rarefaction waves essentially in a direction perpendicular to its planar surface.

In order to increase the acoustical output of transducer assemblies employing such planar piezoelectric elements, structural arrangements have been devised which operate to cause the compression and rarefaction waves generated on opposite sides of the element node and also on opposite sides of the plane of the piezoelectric element to combine through constructive interference. As a consequence, a generally spherical radiation pattern is typically generated by these transducers directed from one planar side of the piezoelectric element along an axis perpendicular to its plane. In such a spherical radiation pattern, the energy level is at a maximum along the axis, decreasing first gradually then rapidly with increasing angular offset from the axis. For example, at a point 45° off the axis, the energy level has decreased by approximately six decibels from the level on the axis. Thus, it is apparent that the spherical radiation patterns generated by these prior art transducer assemblies are basically unidirectional along the subject axis. Conversely, it is noted that these transducers when used to detect acoustical waves are equally more sensitive to waves received along this axis.

Transducers characterized by having essentially unidirectional radiation patterns can be advantageously employed in ultrasonic detection systems by mounting them in adjustable mounts since their axes of radiation may be set, and/or repositioned as necessary to effectively monitor an area to be protected.

In many instances, however, it is desirable to be able to control the shape of the radiation pattern of transducers particularly where it is desired to cover a long narrow hallway or isle on one hand or a large room area on the other hand.

SUMMARY OF THE INVENTION

It is, accordingly, an object of the present invention to provide an improved piezoelectric transducer assembly suitable for use in ultrasonic detection systems which will provide a cone shaped radiation and obviate the disadvantages arising from the unidirectional radiation characteristics of the aforementioned prior art transducer assemblies.

It is further an object of the present invention to provide an improved piezoelectric transducer assembly characterized by being operable to generate a cone shaped pattern of acoustical radiation at a selected frequency, such as an ultrasonic frequency, and conversely having corresponding sensitivity to acoustical energy waves of the same frequency.

It is also an object of the present invention to provide a method for generating a cone shaped radiation pattern symmetrically about a selected axis.

In accomplishing these and other objects, a plurality of circumferentially spaced apart sound sources, each of which generates essentially a spherical radiation pattern, are provided by a piezoelectric element mounted in a resonant cavity, commonly called a Helmholtz chamber. The sound sources are defined by circumferentially spaced apart circular apertures in the cylindrical side wall of the Helmholtz chamber. The apertures are spaced apart and aligned in a manner that their spherical radiation patterns add for forming an annular radiation pattern concentric with the longitudinal axis of the Helmholtz chamber. Spaced apart from the apertures a selected distance is a reflecting plate. The plate extends outwardly at an acute angle to the longitudinal axis of the Helmholtz chamber and reflects the portion of the radiation of the annular pattern directed thereon in such a manner that reflected radiation adds with nonreflected radiation to form from the annular pattern a cone shaped radiation pattern concentric with the axis of the Helmholtz chamber. In a preferred embodiment, the reflecting surface is in the shape of a cone whose axis of rotation is co-aligned with the axis of the chamber and the shape of the reflecting surface controls the shape of the conical radiation pattern.

Additional objects reside in the specific construction of the exemplary piezoelectric transducer assembly hereinafter described and its method of operation.

DETAILED DESCRIPTION OF THE PREFERRED EMBODIMENTS

Figure 1:
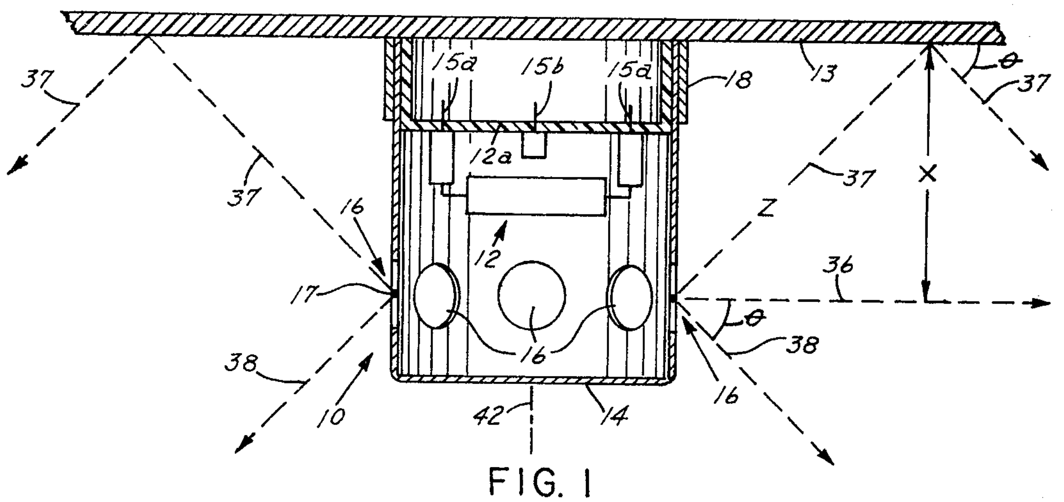
FIG. 1 is a side elevation view partially cut away of a piezoelectric transducer assembly according to the present invention.
Figure 2:
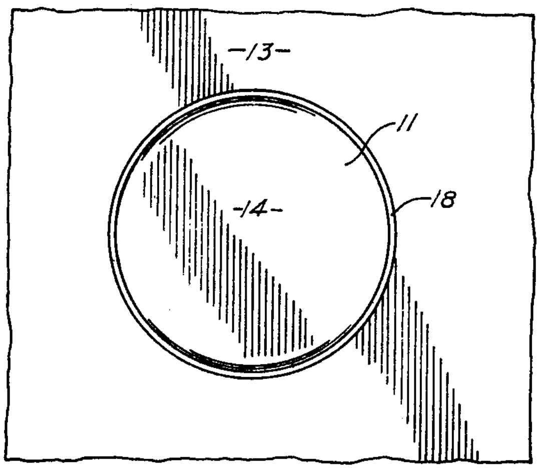
FIG. 2 is a plan view of the assembly of FIG. 1.

Referring to the drawings in more detail, there is shown in FIGS. 1 and 2 a transducer assembly generally identified by the numeral 10. The assembly 10 is made up of a resonant chamber 11, a transducer 12 and a reflecting plate 13.

The resonant chamber 11 has both ends closed to define a resonant chamber and is of conventional construction, being of the type generally referred to as a Helmholtz chamber. As shown in FIG. 1, the upper positioned end of the chamber 11 is closed by the support **12*a* supporting transducer 12 while its lower end is closed by end wall 14. The reflecting plate 13 extends to each side of the chamber 11 in a plane substantially perpendicular to the longitudinal axis of the chamber 11.**

Mounted within the chamber 11 to extend symmetrically and perpendicularly across its longitudinal axis is the transducer 12. The transducer 12 is mounted upon support **12*a* in a conventional manner and includes a piezoelectric element 20,** shown in FIGS. 3 and 4.

Figure 3:
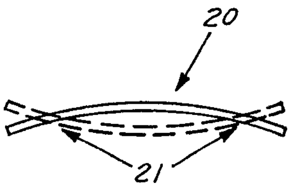
FIG. 3 is a side view of the piezoelectric element incorporated in the transducer of the assembly of FIG. 1.
Figure 4:
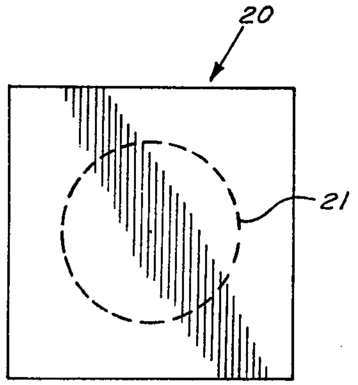
FIG. 4 is a plan view of the element of FIG. 3.

The element 20 is a flat plate-like bender type of piezoelectric element, such as the bender type of piezoelectric element made by Clevite Corporation under the same BIMORPH, which in response to an electrical field applied perpendicularly to its flat surfaces, flexes or bends as shown about its node 21. The element 20 is shown in FIG. 4 as being rectangular with a circular node 21. The location of the node 21 is shown in dashed lines in FIG. 4. As shown by FIG. 3, the element edge portions are always moving in the direction opposite to the direction of movement of the element center portion within the node 21. In FIG. 3, the element 20 is shown in its upwardly bent position in solid lines and in its downwardly bent position in dashed lines.

The piezoelectric element 20 has a selected, preferably ultrasonic, natural resonant frequency and is mounted in the transducer 12 for free vibration about its node 21. Included in the transducer 12 is structure which causes the compression and rarefaction waves generated on opposite sides of the element node 21 to be phase shifted so as to combine through constructive interference and reinforce each other. Additionally, the element 20 is held in the transducer 12 appropriately spaced from the adjacent surface of support **12*a* so that sound waves generated on opposite sides of the plane of the element 20 are reflected to constructively interfere and hence reinforce each other. Further, the transducer 12 includes electrical contacts and terminals 15*a* and 15*b* through which electrical signals may be picked off or applied to the opposite faces of the piezoelectric element 20.**

It is noted that one suitable manner in which the piezoelectric element 20 may be mounted and held in the transducer 12 is disclosed in U.S. Pat. No. 3,704,385 issued Nov. 28, 1972, to Schweitzer et al.

When the piezoelectric element 20 is electrically excited at its natural resonant frequency, the transducer 21 operates in a conventional manner within the chamber 11 to generate a spherical radiation pattern 30. The resonant frequency of the element 20 is here assumed to be an ultrasonic resonant frequency.

Figure 5:
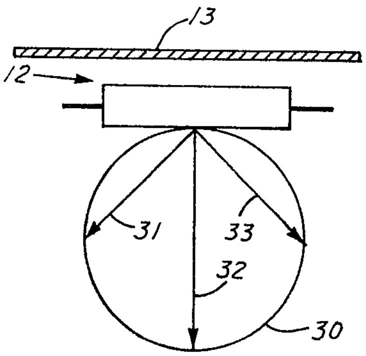
FIG. 5 is a side elevation view of the transducer of FIG. 1 illustrating a cross sectional view of the radiation pattern generated thereby within the resonant cavity of the assembly of FIG. 1.

A cross sectional view of the spherical radiation pattern 30 is shown in FIG. 5. Sound vectors 31, 32 and 33 are there identified. The vector 32 lies on the longitudinal axis of the chamber 11 while the sound energy vectors 31 and 33 are offset 45° from the vector 32 on diametrically opposite sides of the spherical pattern 30.

The Helmholtz chamber 11 defines a resonant cavity of appropriate length and is axially adjustable with respect to support **12*a* to provide a resonant frequency corresponding to the resonant frequency of the piezoelectric element 20. As a consequence, the acoustical output of the transducer 12 is amplified by the resonant action of the Helmholtz chamber 11. The chamber 11 is retained in position with respect to support 12*a* by a clamping ring 18.**

Formed a predetermined distance from the reflecting plate 13 are a plurality of circumferentially spaced apart radially aligned apertures 16 in the cylindrical side wall of the Helmholtz chamber 11. Each aperture or opening 16 is a circle having a diameter equal to approximately one-half wavelength of the ultrasonic resonant frequency of the element 20. The wavelength of the resonant frequency is hereinafter referred to as $\lambda$.

The apertures 16 are circumferentially spaced apart around the chamber cylindrical side wall with their centers 17 lying in a plane parallel to the plate 13 and a distance of approximately one $\lambda$ between their adjacent centers 17. For reasons hereinafter explained, the distance X between each aperture centerpoint 17 and the plane of the plate 13 measured along a normal to the plate 13 is equal to $m\lambda$ sine $\theta°$, where $m$ is equal to any whole number, e.g. one, two, three, etc. and $\theta$ is defined as the angle between the principal vector 36 and the vector, i.e. 38, of the energy to be reinforced.

Figure 6:
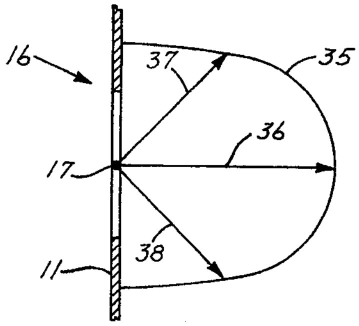
FIG. 6 is a cross sectional elevation view of one of the circular apertures in the side wall of the resonant cavity of the assembly of FIG. 1 illustrating a cross sectional view of the radiation pattern emitted therefrom.

In operation, the Helmholtz chamber 11 converts the spherical radiation pattern 30 generated along its axis by the transducer 12 into a plurality of substantially spherical radiation patterns 35 which are outputted by the apertures 16. Thus, each aperture 16 operates, as shown in FIG. 6, as a discrete sound source to generate a spherical radiation pattern which emanates from the aperture centerpoints 17. The spherical radiation patterns have a maximum energy component along the axis indicated by the vector 36. The vectors 36 from the apertures 16 extend to the aperture centerpoints 17 parallel to the reflecting plate 13. For purposes of discussion, sound components or vectors 37 and 38 which define a plane perpendicular to the reflecting plate 13 are identified. Vectors 37 and 38 are positioned on diametrically opposite sides of the spherical pattern 35 at an angle of $\theta°$ relative to the aperture axis defined by the vector 36. It will be appreciated that maximum reinforcement will occur where $\theta° = 45°$; however, reinforcement can occur where $\theta$ is other than 45° by appropriate spacing of the center 17 of apertures 16 from the surface of reflecting plate 13 to satisfy the relation of the distance X being equal to $m\lambda$ sine $\theta°$, where $\theta$ is the angle between the principal vector 36 parallel to the plate 13 and the vector, i.e., 38, desired to be reinforced.

Due to the one $\lambda$ spacing between the aperture centers 17, the spherical patterns 35 of ultrasonic radiation add together in phase to form an outwardly radiating annular radiation pattern symmetrically around the longitudinal axis of the chamber 11. As this annular radiation pattern radiates outwardly, the portion of it containing the vector 37 soon contacts the reflecting plate 13, as shown in FIG. 1. The vector 37, as shown, strikes the plate 13 at an angle of incidence of 45°. Accordingly, the distance an acoustical wave traveling along the vector 37 has traversed at the time of striking the plate 13 is given by the formula Z equals X divided by sine 45°, where Z equals the distance traveled along the vector 37 and X equals the distance from the aperture centerpoint 17 measured along a normal to the plate 13.

As earlier mentioned, the distance X is selected to equal $m\ \lambda$ sine $\theta$. Thus, by using the above formula, it is apparent that the distance Z equals $m\ \lambda$ sine $\theta°$ divided by sine $\theta$. Accordingly, Z equals $m\ \lambda$. Due to this fact, the acoustical waves reflected from the plate 13 along the path of the vector 37 add in phase with the acoustical waves traveling along vector 38 to form an umbrella shaped radiation pattern 40 around the axis of the Helmholtz chamber 11.

Figure 7:
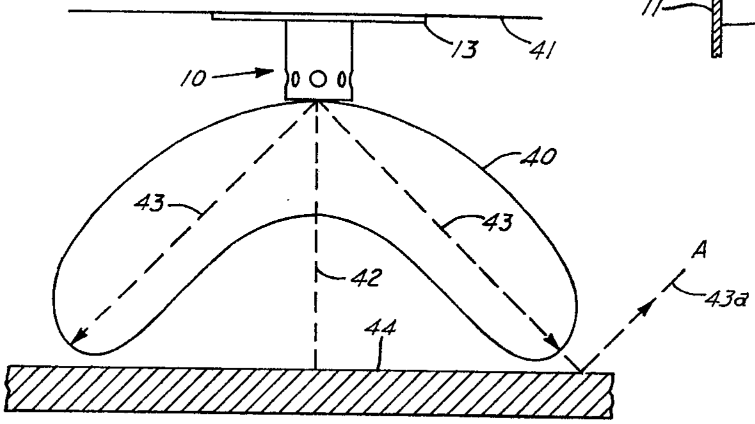
FIG. 7 is a side elevation view of the assembly of FIG. 1 shown mounted on a ceiling illustrating a cross sectional view of the umbrella shaped radiation pattern generated thereby.

A cross sectional view of the umbrella shaped radiation pattern 40 is shown in FIG. 7. The transducer assembly 10 is there shown with its reflecting plate 13 mounted on a ceiling 14 of a room. The axis 42 of the assembly 10 extends vertically downwardly from the ceiling 41. The umbrella shaped toroidal radiation pattern 40 is generated symmetrically 360° around the axis 42 with its maximum energy components being along the vectors 43 which extend at 45° to the axis 42. As illustrated in FIG. 7, the radiation pattern 40 thus provides an umbrella of protection over a relatively large surface area of the floor 44. Also as indicated in FIG. 7, the radiation along vector 43 will be reflected off of surface 44 as 43*a*, so that an object located at position A, normally beyond the immediate coverage of the umbrella will be detected thereby. Also vector 43*a* will reflect off of ceiling 41 and thus may be repeated several times to greatly enlarge the area covered. This is even more pronounced with multiple transducer assemblies.

It is noted that the transducer assembly 10 can also be operated in pickup mode. Referring, for example, to FIG. 7, where $\theta$ is equal to 45°, the maximum sensitivity of the assembly 10 in the pickup mode would be at 45° along the vectors 43 and the receiving sensitivity pattern would be essentially identical to the transmitting pattern there shown.

Figure 8:
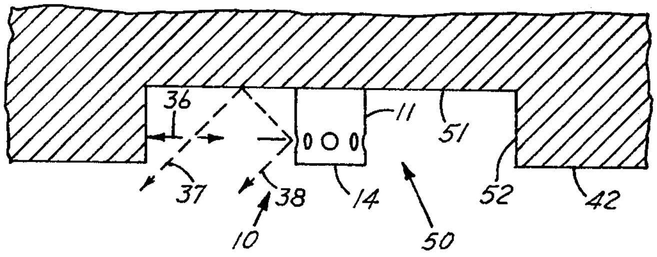
FIG. 8 is a side elevation view partially in cross section of the assembly of FIG. 1 recessed in a cavity.

Referring to FIG. 8, the Helmholtz chamber 11 of the assembly 10 is there shown mounted in a cylindrical cavity 50. The cavity 50 may be defined in a room ceiling or be defined by separate structure for mounting on a wall or ceiling. The cavity 50 is preferably cylindrical in shape, being defined by a top wall 51 and side cylindrical wall 52. A top wall 51, if made of suitable material can serve as the reflecting plate 13, just as a suitable ceiling surface itself could serve as the reflecting plate. The side wall 52 is parallel to the axis of the chamber 11 so that acoustical waves traveling along the vector 36 are not reflected outside of the cavity 50. Further, it is apparent that the cavity must be large enough to permit the acoustical waves traveling along the vector 37 to be reflected there-out-of. The cavity is preferably of a size such that the acoustical waves traveling from the centerpoint of apertures 16 along vector 36 will be reflected such that the reflected waves are in phase with the transmitted waves and serve to reinforce same. Thus, the spacing from the apertures 16 and chamber 11 to the wall 52 of the cavity should be equivalent to $n\ \lambda$, where $n$ is equal to or greater than one wavelength $\lambda$ of the acoustical waves transmitted depending on the umbrella pattern desired. Thus, the portion of the radiation from apertures 16 which strikes wall 52 will be reflected such that the reflected waves are in phase with the transmitted waves and serve to reinforce same. While the wall 52 is preferably normal to the principal transmitted radiation vector 36, other angular relations may be desirable where the greatest sensitivity is desired along a vector where $\theta$ is other than 45°. The wall 52 is preferably positioned at an angle with respect to the plane of the aperture centerpoints which is equal to or greater than 90°. The advantage of mounting the transducer assembly in a recessed location is to make it less vulnerable to being damaged. In FIG. 8, the chamber end 14 lies in the plane of the ceiling 42.

Figure 9:
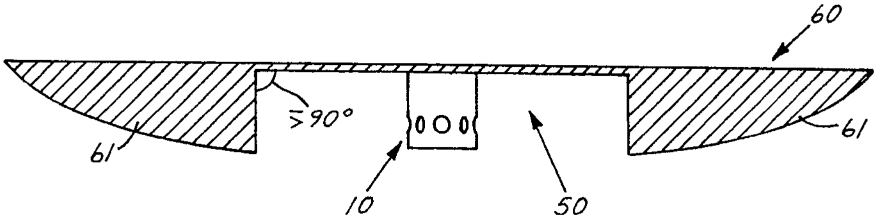
FIG. 9 is a view as in FIG. 8 wherein the cavity in which the assembly is recessed is defined by structure having beveled outer edges.

In FIG. 9, shield structure 60 is shown defining the recess 50. The shield structure 60 is suitable for mounting on a ceiling and has beveled edge portions 61 to improve its aesthetic appearance and as pointed out above to protect same from being struck by foreign objects.

Figure 10:
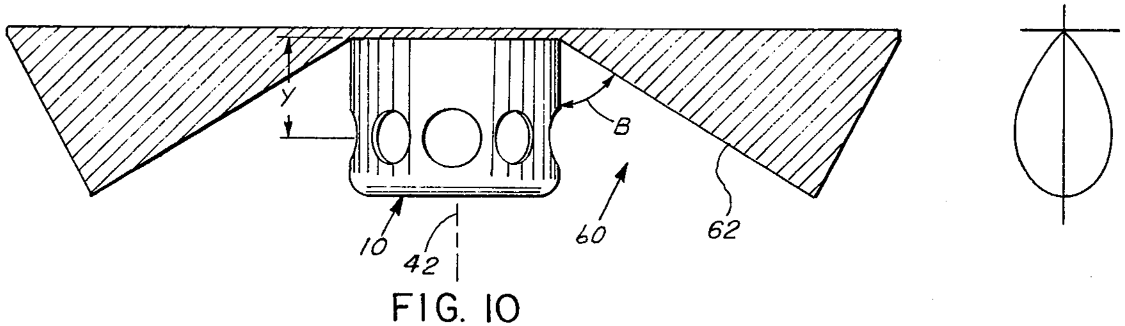
FIG. 10 is a side elevational view partially in cross section of another embodiment of a piezoelectric transducer assembly having a wide radiation pattern; and, FIG. 11 is a side elevational view partially in cross section of still another embodiment of a piezoelectric transducer having a narrow radiation pattern.
Figure 11:
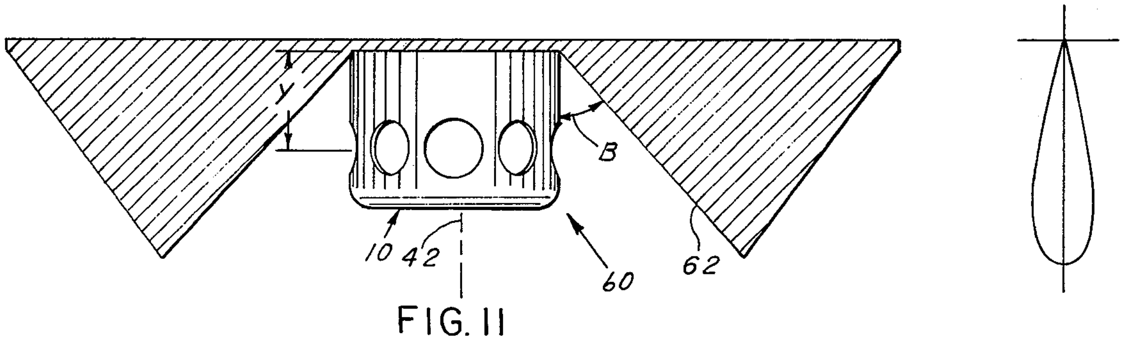

Referring to FIGS. 10 and 11, the Helmholtz chamber 11 of the assembly as there shown mounted in a conical cavity 60 having a side wall 62 inclined at an acute angle $\beta°$ with respect to the longitudinal axis 42 of the chamber 11. As shown, the conical cavity 60 is concentric with the longitudinal axis 42 of the chamber 11. The aperture centerpoints 17 are spaced a distance y from the inclined surface of the reflecting cone such that $y = m\lambda \cos \beta°$ for maximum reinforcement. Again the cavity 60 may be defined in a ceiling or wall or be defined by separate structure for mounting on a wall or ceiling. The cavity 60 is preferably conical in shape but other shapes having a wall inclined at an angle acute to the longitudinal axis of the chamber, will be satisfactory. The radiation pattern of FIG. 10, since angle $\beta°$ is greater than 45° is a fairly broad lobe while the radiation pattern of FIG. 11, since angle $\beta°$ is less than 45° is quite narrow. Thus by proper selection of the angle $\beta°$ the shape of the radiation pattern can be predetermined.

Thus, an improved piezoelectric transducer assembly has been provided which generates a conical shaped radiation pattern by the method of generating one spherical radiation pattern, producing a plurality of substantially spherical radiation patterns from the one, combining the plurality of patterns to form an annular radiation pattern, and reflecting portions of the annular pattern to form the conical shaped radiation pattern.

Although the piezoelectric transducer assembly herein shown and described is what is conceived to be the most practical and preferred embodiment of my invention, it is recognized that various modifications can be made therein in making a transducer assembly in accordance with the spirit of the invention which operates in an equivalent manner to obtain an equivalent result.

What is claimed is:

1. A piezoelectric transducer assembly for generating a radiation pattern of acoustical energy having a cone shaped cross section relative to a selected axis, said assembly comprising:

a resonant chamber having side walls and closed ends and a selected resonant frequency, said chamber being positioned with its longitudinal axis parallel with the side walls and defining the selected axis of said assembly, said chamber having a plurality of spaced apart sound transmitting apertures defined in its side walls about its longitudinal axis, the centerpoints of said apertures defining a plane substantially perpendicular to said selected axis;

piezoelectric transducer means mounted within said chamber for generating therein along said selected axis a spherical radiation pattern of acoustical energy at the resonant frequency of said chamber whereby similar radiation patterns of said acoustical radiation are emitted from each of said apertures along their center axes; and, means defining a conical reflecting surface positioned at an acute angle $\beta$ to the longitudinal axis of the chamber to receive and reflect acoustical waves radiating from the centerpoints of said apertures towards said reflecting surface, said conical reflecting surface being spaced apart from the plane of the centerpoints of said apertures a predetermined distance $y$ at which acoustical waves at said resonant frequency radiating from said apertures towards said reflecting surface are reflected away from said reflecting surface in a cone shaped radiation pattern, said distance $y$ being measured along the side walls of the chamber.

2. The invention of claim 1 wherein the predetermined distance is defined by the equation $y = m\,\lambda \cos \beta$, where $\lambda$ is the resonant wavelength at said frequency and $m$ is a whole number.

3. The invention defined in claim 1 wherein the acute angle $\beta$ is greater than 45°.

4. The invention defined in claim 1, wherein said apertures are circular.

5. The invention defined in claim 1, wherein said apertures are equidistantly spaced apart.

6. The invention defined in claim 1, wherein said apertures are circular and are equidistantly spaced apart at a distance between their centerpoints equal to approximately one wavelength $\lambda$ at said resonant frequency.

7. The invention defined in claim 6, wherein the diameter of each of said apertures is equal to approximately one-half wavelength $\lambda/2$ at said resonant frequency.

8. The invention defined in claim 7, wherein said conical reflecting surface is spaced apart from the plane of the centerpoints of said apertures a distance measured along the side walls of the chamber equal approximately to a whole number of wavelengths at said resonant frequency multiplied by the cos of angle $\beta$.

9. The invention defined in claim 8, wherein said resonant frequency is an ultrasonic resonant frequency.

10. The invention defined in claim 9, wherein said transducer means includes a flat plate-like bender type piezoelectric element.

11. The invention defined in claim 1, wherein said apertures are sized, shaped and spaced apart to emit substantially spherical patterns of radiation of acoustical energy at said resonant frequency which combine in phase with each other.

12. The invention defined in claim 1, wherein the resonant chamber is cylindrical.

13. The invention defined in claim 1, wherein the acute angle $\beta$ is less than 45°.

14. A piezoelectric transducer assembly for generating a cone shaped radiation pattern of acoustical energy around a selected axis, comprising:

means for generating at each of a plurality of substantially equidistantly spaced apart points located substantially equidistantly from said selected axis in a plane substantially perpendicular to said selected axis a similar spherical radiation pattern of acoustical energy which emanates from the one of said points at which generated radially outwardly relative to said selected axis, said spherical radiation patterns being generated at a same selected wavelength to add to form an annular shaped outwardly radiating pattern of acoustical energy at said selected wavelength, said generating means including a piezoelectric transducer element and being positioned to generate said annular shaped radiation pattern concentric with said selected axis; and means defining a conical reflecting surface positioned at an acute angle to said selected axis and positioned with respect to said generating means for reflecting a selected portion of said annular shaped radiation pattern to form said cone shaped radiation pattern around said selected axis.

15. The method of generating a conical shaped radiation pattern of acoustical energy of a selected wavelength around a selected axis, comprising:

generating at each of a plurality of substantially equidistantly spaced apart points located substantially equidistantly from said selected axis in a plane substantially perpendicular to said selected axis a similar spherical radiation pattern of acoustical energy which emanates from the one of said points at which generated radially outwardly relative to said selected axis, said spherical radiation patterns being generated at a same selected wavelength to add to form an annular outwardly radiating pattern of acoustical energy at said selected wavelength concentric with said selected axis; and reflecting a selected portion of the acoustical waves of said annular radiation pattern by a conical reflecting surface positioned at a selected angle $\beta$ to said selected axis to produce a cone shaped radiation pattern.

16. The method of claim 15 including the step of reflecting directly radiating waves from a reflecting surface in phase with the directly radiated waves to reinforce same.

17. The invention defined in claim 15, wherein the plane defined by said points being spaced apart from said conical reflection surface at the location of said points a distance measured along a normal to the plane of said points equal approximately to a whole number of wavelengths at said selected wavelength multiplied by the cos of $\beta$.

18. The invention defined in claim 17, wherein the angle $\beta$ is greater than 45°.

19. The invention defined in claim 17, wherein the angle $\beta$ is less than 45°.

20. The invention defined in claim 1, wherein said conical reflecting surface is positioned concentric with said selected axis.

21. The invention defined in claim 21, wherein said predetermined distance is defined by the equation $y = m\lambda \cos \beta$, where $\lambda$ is the wavelength at said selected resonant frequency and $m$ is a whole number.

22. The invention defined in claim 14, wherein said conical reflecting surface is positioned concentric with said selected axis.

23. The method of claim 15, wherein said conical reflected surface is positioned concentric with said selected axis.

* * * * *